United States Patent
Qian et al.

(10) Patent No.: US 11,255,017 B2
(45) Date of Patent: Feb. 22, 2022

(54) SYSTEMS AND METHODS FOR FLOW MONITORING IN A PRECURSOR VAPOR SUPPLY SYSTEM OF A SUBSTRATE PROCESSING SYSTEM

(71) Applicant: Lam Research Corporation, Fremont, CA (US)

(72) Inventors: Jun Qian, Sherwood, OR (US); Purushottam Kumar, Hillsboro, OR (US); Adrien Lavoie, Newberg, OR (US); You Zhai, Urbana, IL (US); Jeremiah Baldwin, Tualatin, OR (US); Sung Je Kim, Beaverton, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 300 days.

(21) Appl. No.: 16/456,409

(22) Filed: Jun. 28, 2019

(65) Prior Publication Data
US 2020/0407849 A1    Dec. 31, 2020

Related U.S. Application Data

(62) Division of application No. 15/461,417, filed on Mar. 16, 2017, now Pat. No. 10,351,953.

(51) Int. Cl.
*C23C 16/52*    (2006.01)
*C23C 16/455*    (2006.01)

(52) U.S. Cl.
CPC ........ *C23C 16/52* (2013.01); *C23C 16/45525* (2013.01)

(58) Field of Classification Search
CPC .......... C23C 16/45525; C23C 16/4481; C23C 16/4482; C23C 16/52

USPC ......................................................... 137/12
See application file for complete search history.

(56) References Cited

U.S. PATENT DOCUMENTS

| | | | |
|---|---|---|---|
| 2006/0107898 A1* | 5/2006 | Blomberg | ................ G01N 7/18 |
| | | | 118/715 |
| 2010/0062158 A1 | 3/2010 | Hara et al. | |
| 2015/0275358 A1 | 10/2015 | Smith | |
| 2016/0032453 A1 | 2/2016 | Qian et al. | |

(Continued)

FOREIGN PATENT DOCUMENTS

KR    20100105975 A    10/2010

OTHER PUBLICATIONS

Ahmido et al. In situ metrology to characterize water vapor delivery during atomic layer deposition, J. Vac. Sci. Tech. A, 34 031512 (2016). (Year: 2016).

(Continued)

*Primary Examiner* — Elizabeth A Burkhart

(57) ABSTRACT

A method for delivering vaporized precursor in a substrate processing system using a vapor delivery system includes (a) selectively supplying push gas to an inlet of an ampoule storing liquid and vaporized precursor during a deposition period of a substrate; (b) measuring a pressure of the push gas and the vaporized precursor at an outlet of the ampoule during the deposition period; (c) determining a maximum pressure during the deposition period; (d) determining an integrated area for the deposition period based on a sampling interval and the maximum pressure during the sampling interval; and (e) repeating (a), (b), (c) and (d) for a plurality of the deposition periods for the substrate.

11 Claims, 7 Drawing Sheets

(56) References Cited

U.S. PATENT DOCUMENTS

2016/0097127 A1* 4/2016 Lenz .................. C23C 16/4481
                                                    137/12
2018/0265983 A1* 9/2018 Qian .................. C23C 16/4485

OTHER PUBLICATIONS

Singapore Search Report for application No. SG10201802105U dated Sep. 29, 2020.

* cited by examiner

SYSTEMS AND METHODS FOR FLOW MONITORING IN A PRECURSOR VAPOR SUPPLY SYSTEM OF A SUBSTRATE PROCESSING SYSTEM

CROSS-REFERENCE TO RELATED APPLICATIONS

The present disclosure is a divisional of U.S. patent application Ser. No. 15/461,417 filed on Mar. 16, 2017. The entire disclosure of the application referenced above is incorporated herein by reference.

FIELD

The present disclosure relates to substrate processing systems, and more particularly to systems and methods for controlling precursor vapor supplied by a vapor supply system to a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to process substrates such as semiconductor wafers. The processing often involves exposing the substrate in a processing chamber to gas mixtures and/or vaporized precursors. For example only, processes such as chemical vapor deposition (CVD), plasma-enhanced CVD (PECVD), atomic layer deposition (ALD), and plasma-enhanced ALD (PEALD) expose the substrate to one or more gas mixtures and/or vaporized precursors when depositing a layer on the substrate.

The vaporized precursors may be generated using a vapor delivery system including a heated ampoule storing liquid and vapor precursor. A push gas source supplies push gas to the ampoule. The push gas flows through the ampoule and entrains vaporized precursor. The push gas and vaporized precursor are delivered to a processing chamber. However, it is difficult and costly to precisely control the amount of vaporized precursor that is delivered to the processing chamber.

Many vapor delivery systems lack real time flow monitoring or direct dose flux measurement. The reduced level of control and/or monitoring leads to unstable deposition rates, defects and film properties that shift due to cycle-to-cycle or substrate-to-substrate dose fluctuation and/or hardware malfunctions.

SUMMARY

A method for delivering vaporized precursor in a substrate processing system using a vapor delivery system includes (a) selectively supplying push gas to an inlet of an ampoule storing liquid and vaporized precursor during a deposition period of a substrate; (b) measuring a pressure of the push gas and the vaporized precursor at an outlet of the ampoule during the deposition period; (c) determining a maximum pressure during the deposition period; (d) determining an integrated area for the deposition period based on a sampling interval and the maximum pressure during the sampling interval; and (e) repeating (a), (b), (c) and (d) for a plurality of the deposition periods for the substrate.

In other features, the method includes (f) at least one of diagnosing operation of the vapor delivery system and adjusting an operating parameter of the vapor delivery system based on the maximum pressures and the integrated areas. The operating parameter includes at least one of a temperature of the ampoule, a flow rate of the push gas, and a duration of the deposition period. The pressure is measured using a manometer.

In other features, the method includes repeating (a), (b), (c), (d) and (e) for a plurality of substrates. The method includes (f) at least one of diagnosing operation of the vapor delivery system and adjusting an operating parameter of the vapor delivery system based on the maximum pressures and the integrated areas for the plurality of substrates.

In other features, the method includes performing chemical vapor deposition in the substrate processing system. The method includes performing atomic layer deposition in the substrate processing system.

In other features, the method includes (f) averaging the maximum pressures for the plurality of deposition periods for each of the plurality of substrates; and (g) at least one of diagnosing operation of the vapor delivery system and adjusting an operating parameter of the vapor delivery system based on the averaged maximum pressures for the plurality of substrates.

In other features, the method includes (f) averaging the integrated areas for the plurality of deposition periods for each of the plurality of substrates; and (g) at least one of diagnosing operation of the vapor delivery system and adjusting an operating parameter of the vapor delivery system based on the averaged integrated areas for the plurality of substrates.

In other features, the method includes (f) averaging the integrated areas for the plurality of deposition periods for each of the plurality of substrates; (g) averaging the maximum pressures for the plurality of deposition periods for each of the plurality of substrates; and (h) at least one of diagnosing operation of the vapor delivery system and adjusting an operating parameter of the vapor delivery system based on the averaged maximum pressures and the averaged integrated areas for the plurality of substrates.

A vapor delivery system for a substrate processing system includes an ampoule that includes an inlet and an outlet and that stores liquid precursor and vaporized precursor. A mass flow controller (MFC) selectively supplies push gas. A plurality of valves selectively supply push gas to the inlet of the ampoule. A manometer measures pressure at an outlet of the ampoule. A valve selectively i) diverts the vaporized precursor, or (ii) supplies the vaporized precursor to a processing chamber. A controller in communication with the MFC, the plurality of valves and the manometer is configured to (a) selectively supply push gas to an inlet of an ampoule storing liquid and vaporized precursor during a deposition period of a substrate; (b) cause a pressure of the push gas and the vaporized precursor at an outlet of the ampoule to be measured during the deposition period; (c) determine a maximum pressure during the deposition period; (d) determine an integrated area for the deposition period based on a sampling interval and the maximum pressure during the sampling interval; and (e) repeat (a), (b), (c) and (d) for a plurality of the deposition periods for the substrate.

In other features, the controller is further configured to (f) at least one of diagnose operation of the vapor delivery system and adjust an operating parameter of the vapor delivery system based on the maximum pressures and the integrated areas. The operating parameter includes at least one of a temperature of the ampoule, a flow rate of the push gas, and a duration of the deposition period.

In other features, a manometer in communication with the controller measures the pressure at an outlet of the ampoule. The controller is further configured to repeat (a), (b), (c), (d) and (e) for a plurality of substrates.

In other features, the controller is further configured to (f) at least one of diagnose operation of the vapor delivery system and adjust an operating parameter of the vapor delivery system based on the maximum pressures and the integrated areas for the plurality of substrates.

In other features, the substrate processing system performs chemical vapor deposition. The substrate processing system performs atomic layer deposition. The controller is further configured to (f) average the maximum pressures for the plurality of deposition periods of the plurality of substrates; and (g) at least one of diagnose operation of the vapor delivery system and adjust an operating parameter of the vapor delivery system based on the averaged maximum pressures.

In other features, the controller is further configured to (f) average the integrated areas for the plurality of deposition periods of the plurality of substrates; and (g) at least one of diagnose operation of the vapor delivery system and adjust an operating parameter of the vapor delivery system based on the averaged integrated areas.

In other features, the controller is further configured to (f) average the integrated areas for the plurality of deposition periods of the plurality of substrates; (g) average the maximum pressures for the plurality of deposition periods of the plurality of substrates; and (h) at least one of diagnose operation of the vapor delivery system and adjust an operating parameter of the vapor delivery system based on the averaged maximum pressures and the averaged integrated areas.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure relates to systems and methods for real-time dose flux monitoring using a monometer rather than a significantly more expensive mass flow meter. In some examples, the systems and methods include determining maximum pressure and integrated area (corresponding to ampoule pressure*time) during each cycle when the ampoule is open, determining average maximum pressure and average integrated area for the substrate over a plurality of the deposition cycles, and repeating the calculations for multiple substrates. The calculations can be used to diagnose operation of the vapor delivery system or to adjust one or more operating parameters of the vapor delivery system.

The systems and methods described herein provide dose flux information for each individual cycle and/or for multiple deposition cycles performed on the substrate. By averaging or performing another function on the data corresponding to each substrate, substrate to substrate trends can be determined. The systems and methods can be used to identify errors when the dose flux varies from cycle to cycle or from substrate to substrate.

Figure 1:
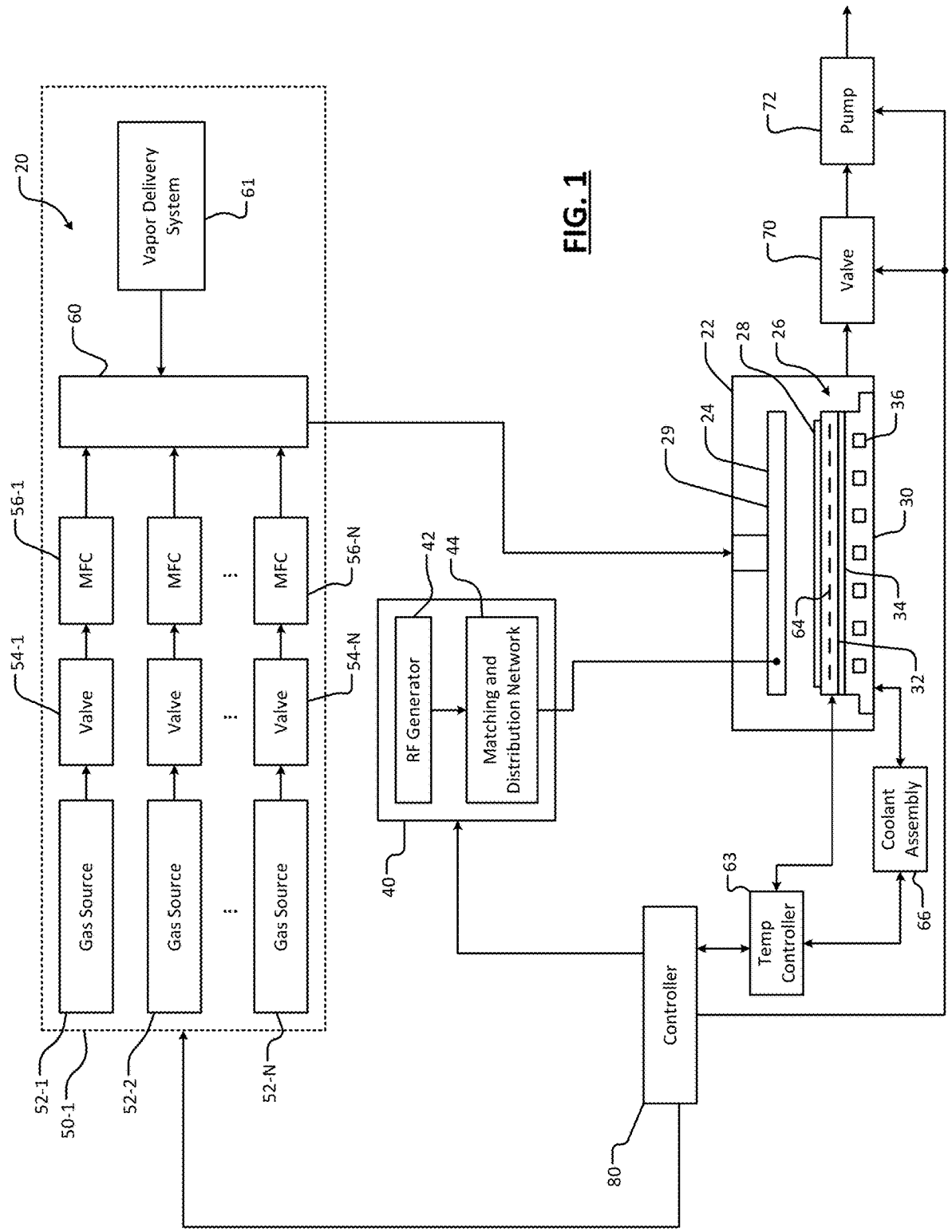
FIG. 1 is a functional block diagram of an example of a substrate processing system including a vapor delivery system according to the present disclosure.

Referring now to FIG. 1, an example substrate processing system 20 is shown. While the foregoing example will be described in the context of plasma enhanced chemical vapor deposition (PECVD), the present disclosure may be applied to other substrate processing systems such as atomic layer deposition (ALD), PEALD, CVD, or other process. The substrate processing system 20 includes a processing chamber 22 that encloses other components of the substrate processing system 20 and contains the RF plasma (if used). The substrate processing system 20 includes an upper electrode 24 and an electrostatic chuck (ESC) 26 or other substrate support. During operation, a substrate 28 is arranged on the ESC 26.

For example only, the upper electrode 24 may include a gas distribution device 29 such as a showerhead that introduces and distributes process gases. The gas distribution device 29 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which vaporized precursor, process gas or purge gas flows. Alternately, the upper electrode 24 may include a conducting plate and the process gases may be introduced in another manner.

The ESC 26 includes a baseplate 30 that acts as a lower electrode. The baseplate 30 supports a heating plate 32, which may correspond to a ceramic multi-zone heating plate. A thermal resistance layer 34 may be arranged between the heating plate 32 and the baseplate 30. The baseplate 30 may include one or more channels 36 for flowing coolant through the baseplate 30.

If plasma is used, an RF generating system 40 generates and outputs an RF voltage to one of the upper electrode 24 and the lower electrode (e.g., the baseplate 30 of the ESC 26). The other one of the upper electrode 24 and the baseplate 30 may be DC grounded, AC grounded or floating. For example only, the RF generating system 40 may include an RF generator 42 that generates RF power that is fed by a matching and distribution network 44 to the upper electrode 24 or the baseplate 30. In other examples, the plasma may be generated inductively or remotely.

A gas delivery system 50 includes one or more gas sources 52-1, 52-2, . . . , and 52-N (collectively gas sources 52), where N is an integer greater than zero. The gas sources 52 are connected by valves 54-1, 54-2, . . . , and 54-N (collectively valves 54) and mass flow controllers 56-1, 56-2, . . . , and 56-N (collectively mass flow controllers 56) to a manifold 60. A vapor delivery system 61 supplies vaporized precursor to the manifold 60 or another manifold (not shown) that is connected to the processing chamber. An output of the manifold 60 is fed to the processing chamber 22.

A temperature controller 63 may be connected to a plurality of thermal control elements (TCEs) 64 arranged in the heating plate 32. The temperature controller 63 may be used to control the plurality of TCEs 64 to control a temperature of the ESC 26 and the substrate 28. The temperature controller 63 may communicate with a coolant assembly 66 to control coolant flow through the channels 36. For example, the coolant assembly 66 may include a coolant pump, a reservoir and/or one or more temperature sensors. The temperature controller 63 operates the coolant assembly 66 to selectively flow the coolant through the channels 36 to cool the ESC 26.

A valve 70 and pump 72 may be used to evacuate reactants from the processing chamber 22. A system controller 80 may be used to control components of the substrate processing system 10.

Figure 2:
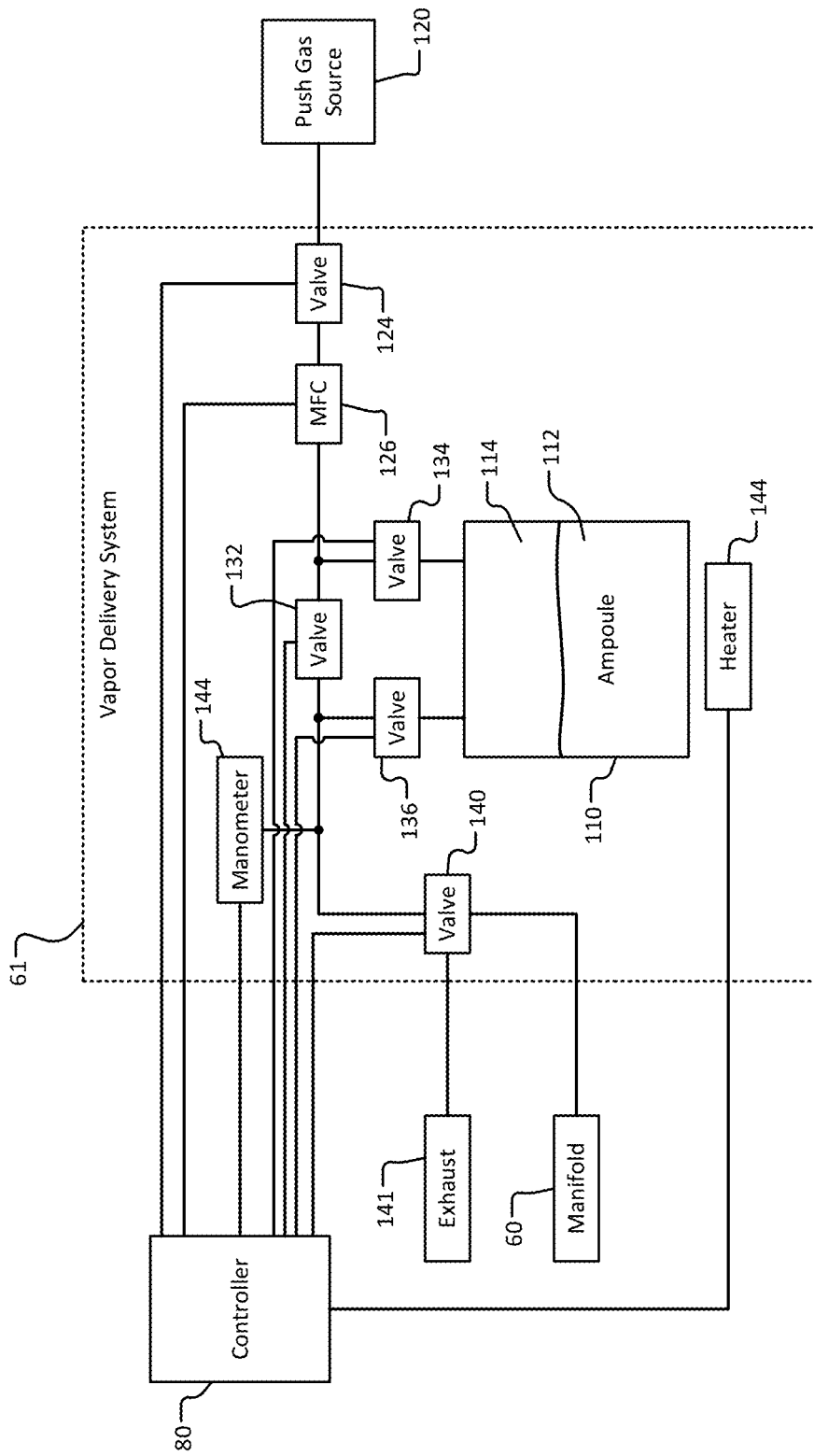
FIG. 2 is a functional block diagram of an example of a vapor delivery system according to the present disclosure.

Referring now to FIG. 2, the vapor delivery system 61 receives gas from a push gas source 120. A flow rate of push gas output by the push gas source 120 is modulated by a mass flow controller (MFC) 126 or other flow control device. A valve 124 may be arranged between the push gas source 120 and the MFC 126. An output of the MFC 126 is connected to inlets of valves 132 and 134. An outlet of the valve 134 is connected to an ampoule 110 containing liquid precursor 112 and vaporized precursor 114. An outlet of the valve 132 is connected to an inlet of a valve 136 and an inlet of a valve 140. An outlet of the valve 136 is connected to an outlet of the ampoule 110. Outlets of the valve 140 are connected to the manifold 60 and an exhaust system 141.

When not in use, the valves 132, 134 and 136 may be in a closed state. During a period immediately prior to deposition, the valve 140 may be arranged in a diverting position to an exhaust system 141 to allow flow of the vaporized precursor to reach steady state. During this period the valves 134 and 136 are opened and the valve 132 is closed. Push gas from the push gas source 120 is directed through the valve 134, the ampoule 110, the valve 136 and the valve 142 into the exhaust system 141.

During deposition, the valve 140 is arranged in a non-diverting position to allow flow of the vaporized precursor to flow to the manifold 60 rather than the exhaust system 141. During deposition, the valves 134 and 136 are opened and the valve 132 is closed. Push gas from the push gas source 120 is directed through the valve 134, the ampoule 110, the valve 136 and the valve 142 into the manifold 60.

Figure 3:
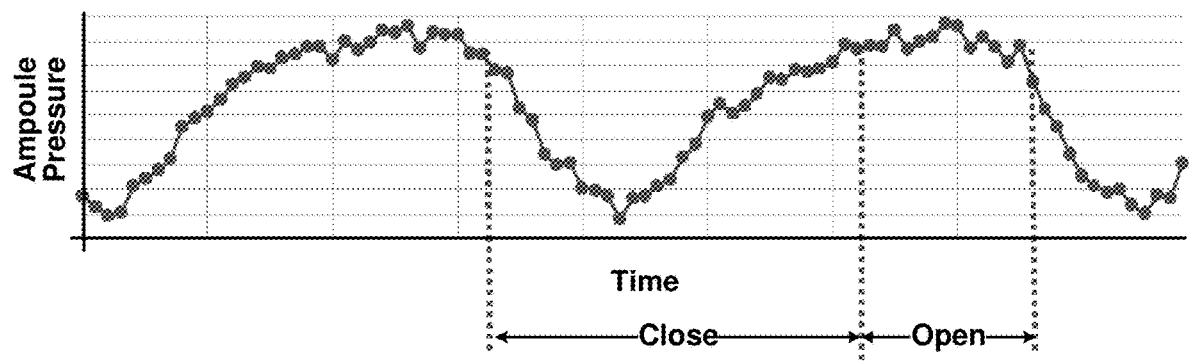
FIG. 3 is a graph illustrating an example of ampoule pressure as a function of time during a deposition cycle.

Referring now to FIG. 3, ampoule pressure varies as a function of time preceding and during deposition. When the valves 134 and 136 are opened and the valve 132 is closed, the valve 140 is moved into the diverting or "closed" position, the ampoule pressure decreases and then increases towards a steady-state value. When the valve 140 is moved into the non-diverting or "open" position, the ampoule pressure has a generally stable value with some pressure variation. In some examples, a period of the diverting or "closed" position is in a range from 0.1 seconds to 2 seconds. In some examples, a period of the non-diverting or "open" position is in a range from 0.1 seconds to 2 seconds. In some examples, a plurality of deposition cycles is performed on the substrate.

Figure 4:
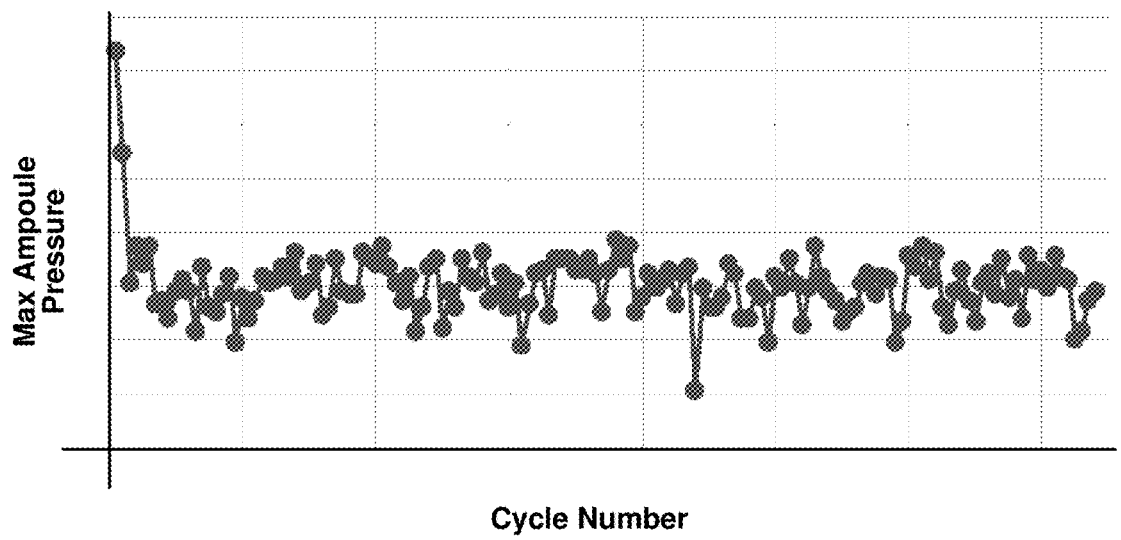
FIG. 4 is a graph illustrating an example of maximum ampoule pressure during a plurality of deposition cycles.
Figure 5:
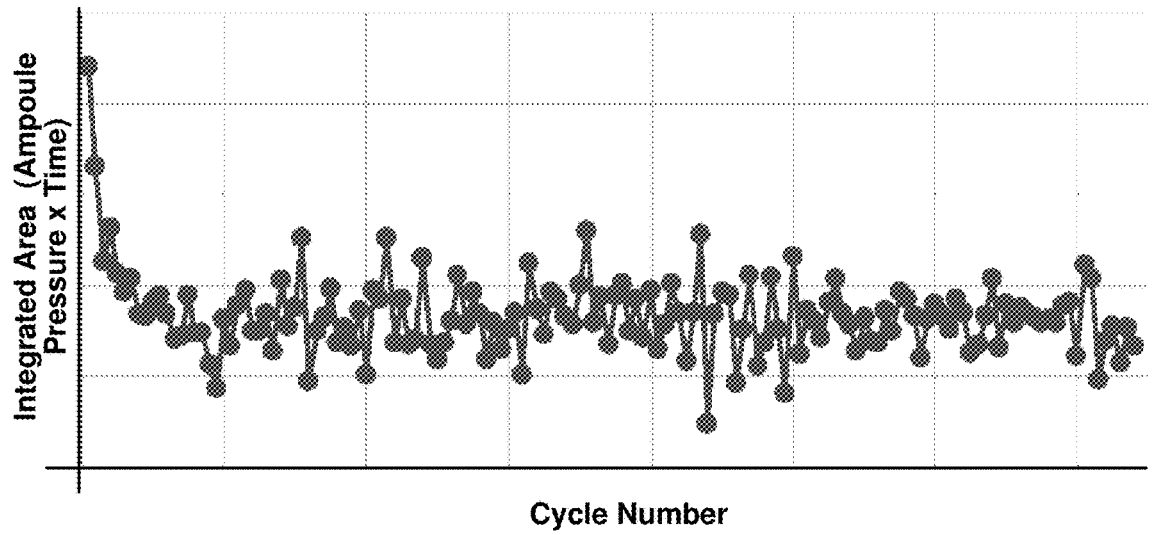
FIG. 5 is a graph illustrating an example of integrated area (ampoule pressure*time) during a plurality of deposition cycles.

Referring now to FIG. 4-5, during each deposition cycle, the maximum ampoule pressure is determined and stored during the non-diverting or "open" position as shown in FIG. 4. In addition, during each deposition cycle, an integrated area (ampoule pressure*time) is determined and stored during the non-diverting or "open" position as shown in FIG. 5. In some examples, the time corresponds to a sample rate of the ampoule pressure. The maximum ampoule pressure during multiple cycles is averaged and stored for the substrate. Likewise, the integrated area during multiple cycles is averaged and stored.

Figure 6:
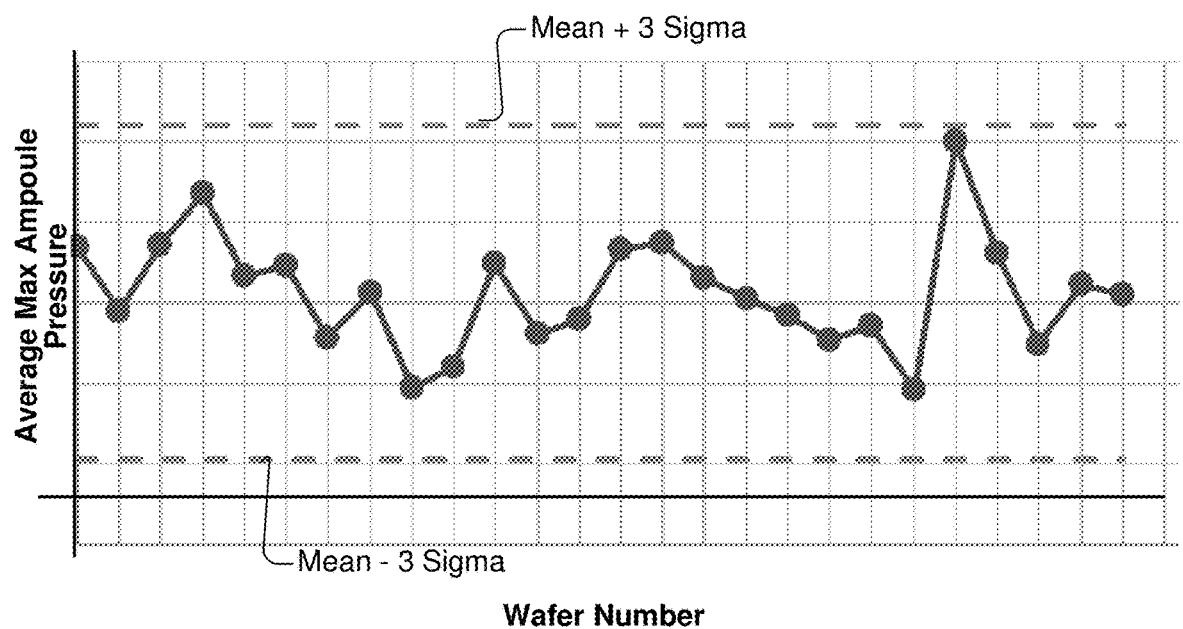
FIG. 6 is a graph illustrating an example of average maximum ampoule pressure for a plurality of wafers.
Figure 7:
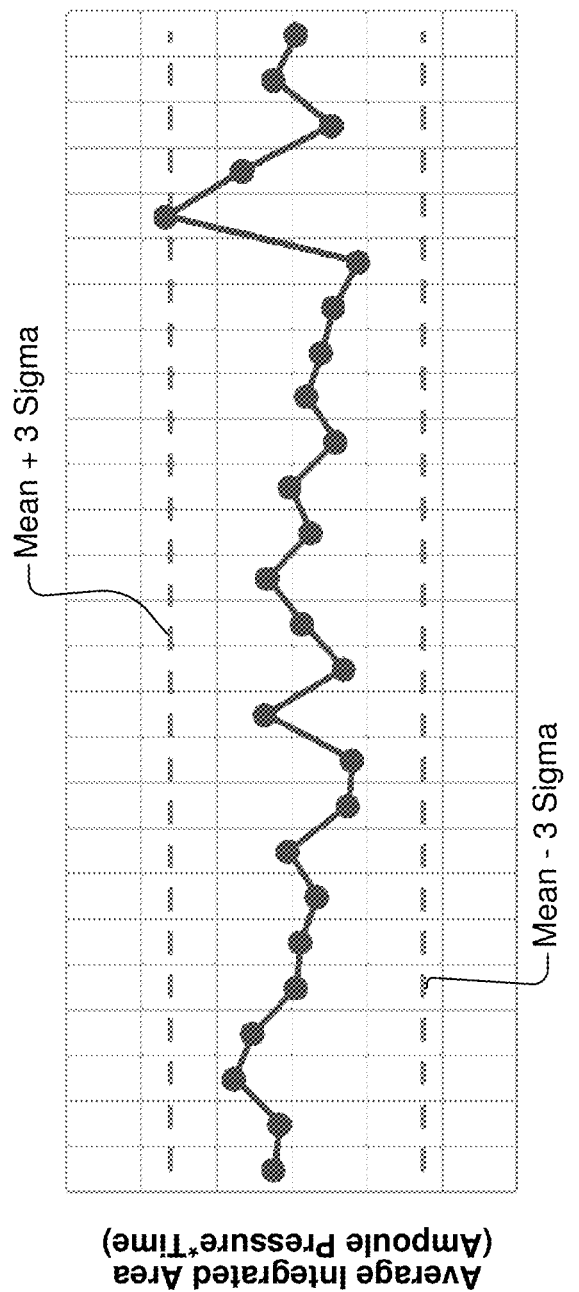
FIG. 7 is a graph illustrating an example of average integrated area (ampoule pressure*time) for a plurality of wafers.

Referring now to FIGS. 6-7, the steps illustrated in FIGS. 4 and 5 are repeated for additional substrates. In FIG. 6, average maximum ampoule pressure during deposition is determined for a plurality of substrates. In FIG. 7, average integrated area (ampoule pressure*time) during deposition is determined for a plurality of substrates.

Figure 8:
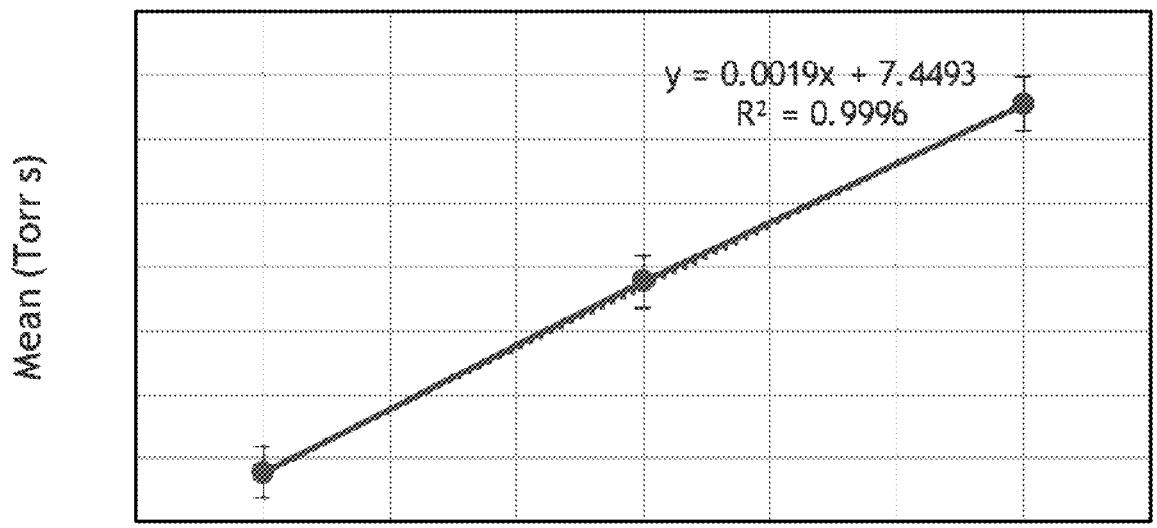
FIG. 8 is a graph illustrating an example of integrated area (ampoule pressure*time) as a function of push gas flow.
Figure 9:
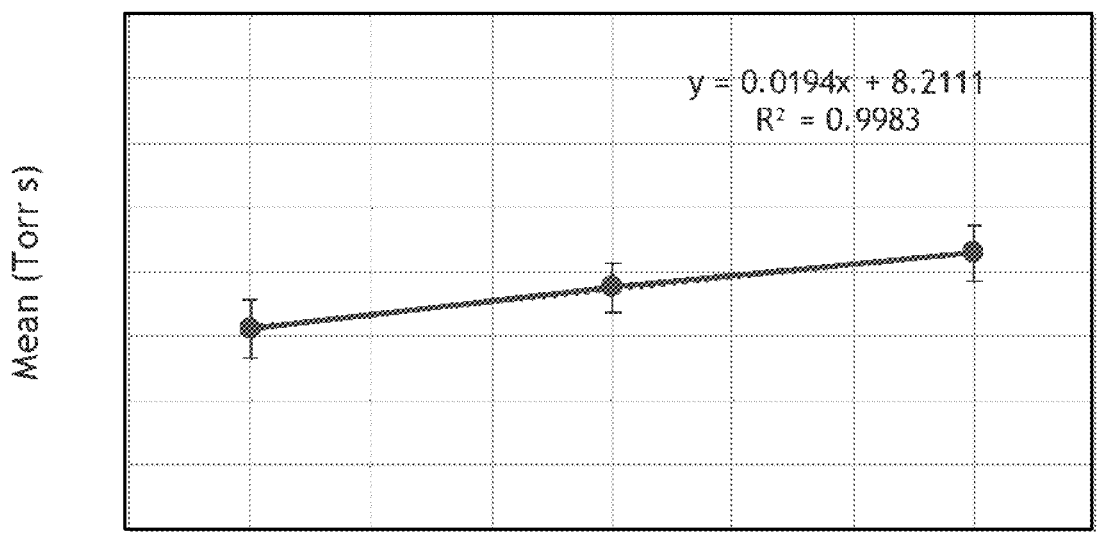
FIG. 9 is a graph illustrating an example of integrated area (ampoule pressure*time) as a function of ampoule temperature.

Referring now to FIGS. 8-9, based on the foregoing calculations, diagnosis and/or control of the vapor delivery system can be performed. For example, performing the foregoing measurements and calculations while varying push gas flow allows integrated area (ampoule pressure*time) to be characterized as a function of push gas flow. In other words, push gas flow can be varied to adjust vaporized precursor dose flux as can be seen in FIG. 8.

For example, performing the foregoing measurements and calculations while varying ampoule temperature allows integrated area (ampoule pressure*time) to be characterized as a function of ampoule temperature. In other words, ampoule temperature can be varied to adjust vaporized precursor dose flux as can be seen in FIG. 9.

Figure 10:
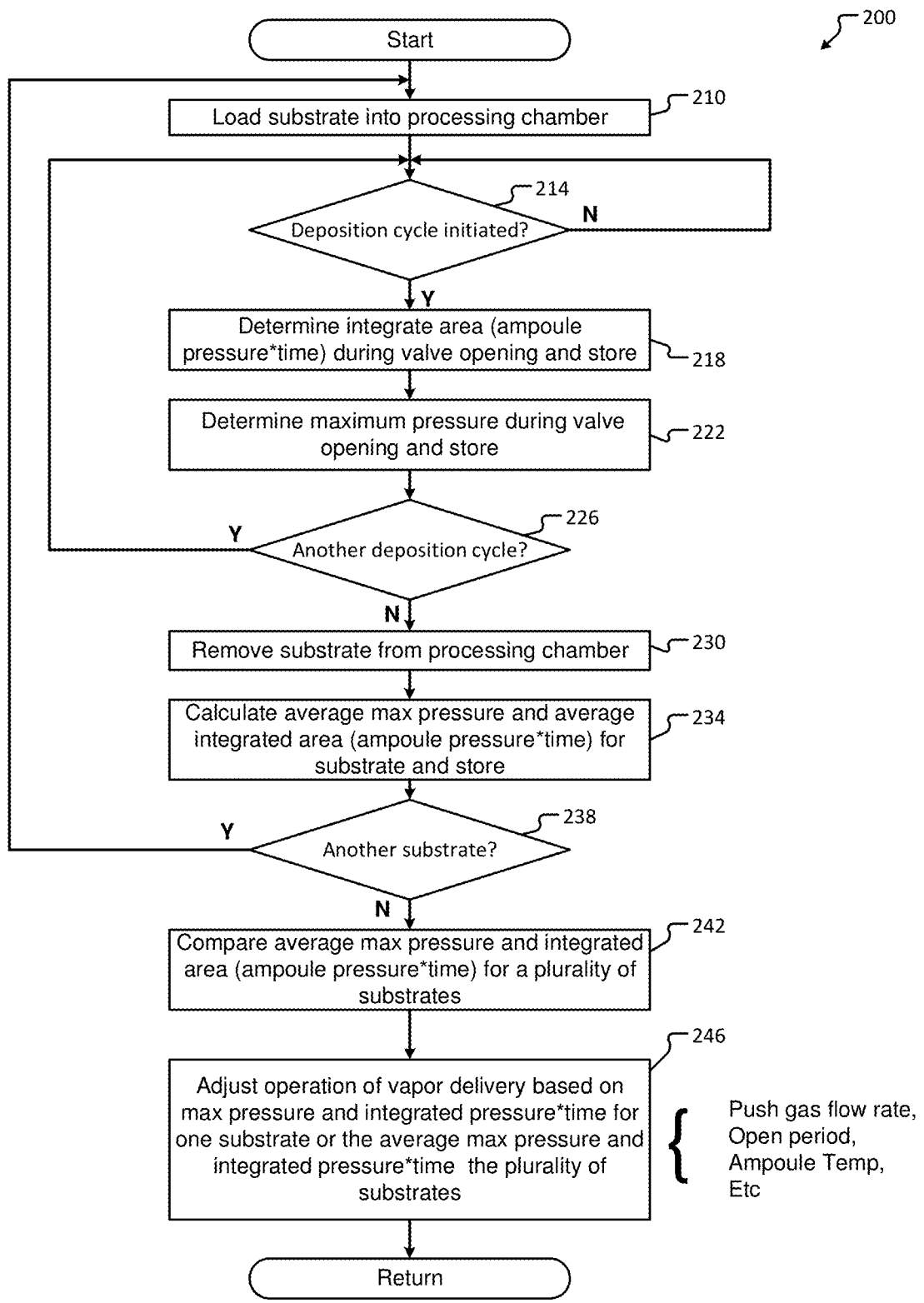
FIG. 10 is a flowchart illustrating a method for controlling and/or diagnosing operation of the vapor draw system according to the present disclosure.

Referring now to FIG. 10, a method 200 for controlling and/or diagnosing operation of the vapor draw system according to the present disclosure is shown. At 210, a substrate is loaded into the processing chamber. At 214, the method determines whether a deposition cycle is initiated. In some examples, the deposition cycle corresponds to the non-diverting or open position of the valve 140.

When 214 is true, the method generates integrated area by multiplying ampoule pressure*time when the valve 140 is open (e.g., vaporized precursor is delivered to the manifold 60) and stores the integrated area at 218. At 222, the maximum ampoule pressure is determined during the deposition cycle. At 226, the method determines whether another deposition cycle is to be performed on the substrate. If 226 is true, the method returns to 218. Otherwise, the method continues with 230 and the substrate is removed from the processing chamber.

At 234, the method calculates the average maximum ampoule pressure and integrated area (corresponding to ampoule pressure*time) for the substrate and stores the values. At 238, the method determines whether deposition is to be performed on another substrate. If 238 is true, the method returns to 210. If 238 is false, the method continues at 242 and compares the average maximum pressure and integrated area corresponding to ampoule pressure*time for a plurality of substrates.

At 246, operation of the vapor delivery system is adjusted or diagnosed based on max pressure and integrated pressure*time for one substrate or a plurality of substrates. Alternately, operation of the vapor delivery system is adjusted or diagnosed based on the average maximum pressure and integrated pressure*time for the plurality of substrates. For example, operation of the vapor delivery system can be adjusted by adjusting push gas flow rates, an opening period of the valves 134, 136 and/or, ampoule temperature or other operating parameters. Alternately, these values can be used for diagnosing process drift or other error conditions.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for delivering vaporized precursor in a substrate processing system using a vapor delivery system, comprising:
   (a) selectively supplying push gas to an inlet of an ampoule storing liquid and vaporized precursor during a deposition period of a substrate;
   (b) measuring a pressure of the push gas and the vaporized precursor at an outlet of the ampoule during the deposition period;
   (c) determining a maximum pressure during the deposition period;
   (d) determining an integrated area for the deposition period based on a sampling interval and the maximum pressure during the sampling interval; and
   (e) repeating (a), (b), (c) and (d) for a plurality of the deposition periods for the substrate.

2. The method of claim 1, further comprising:
   (f) at least one of diagnosing operation of the vapor delivery system and adjusting an operating parameter of the vapor delivery system based on the maximum pressures and the integrated areas.

3. The method of claim 2, wherein the operating parameter includes at least one of a temperature of the ampoule, a flow rate of the push gas, and a duration of the deposition period.

4. The method of claim 1, wherein the pressure is measured using a manometer.

5. The method of claim 1, further comprising repeating (a), (b), (c), (d) and (e) for a plurality of substrates.

6. The method of claim 5, further comprising:
   (f) at least one of diagnosing operation of the vapor delivery system and adjusting an operating parameter of the vapor delivery system based on the maximum pressures and the integrated areas for the plurality of substrates.

7. The method of claim 5, further comprising:
   (f) averaging the maximum pressures for the plurality of deposition periods for each of the plurality of substrates; and
   (g) at least one of diagnosing operation of the vapor delivery system and adjusting an operating parameter of the vapor delivery system based on the averaged maximum pressures for the plurality of substrates.

8. The method of claim 5, further comprising:
   (f) averaging the integrated areas for the plurality of deposition periods for each of the plurality of substrates; and
   (g) at least one of diagnosing operation of the vapor delivery system and adjusting an operating parameter of the vapor delivery system based on the averaged integrated areas for the plurality of substrates.

9. The method of claim 5, further comprising:
   (f) averaging the integrated areas for the plurality of deposition periods for each of the plurality of substrates;
   (g) averaging the maximum pressures for the plurality of deposition periods for each of the plurality of substrates; and
   (h) at least one of diagnosing operation of the vapor delivery system and adjusting an operating parameter of the vapor delivery system based on the averaged maximum pressures and the averaged integrated areas for the plurality of substrates.

10. The method of claim 1, further comprising performing chemical vapor deposition in the substrate processing system.

11. The method of claim 1, further comprising performing atomic layer deposition in the substrate processing system.

* * * * *